(12) United States Patent
Feichtinger et al.

(10) Patent No.: US 10,856,412 B2
(45) Date of Patent: Dec. 1, 2020

(54) SUBSTRATE

(71) Applicant: TDK Electronics AG, Munich (DE)

(72) Inventors: Thomas Feichtinger, Graz (AT);
Katharina Tauber, Lassnitzhoehe (AT);
Roman Geier, Graz (AT)

(73) Assignee: TDK ELECTRONICS AG, Munich (DE)

( * ) Notice: Subject to any disclaimer, the term of this patent is extended or adjusted under 35 U.S.C. 154(b) by 0 days.

(21) Appl. No.: 16/768,179

(22) PCT Filed: Jul. 23, 2019

(86) PCT No.: PCT/EP2019/069823
§ 371 (c)(1),
(2) Date: May 29, 2020

(87) PCT Pub. No.: WO2020/020900
PCT Pub. Date: Jan. 30, 2020

(65) Prior Publication Data
US 2020/0296829 A1    Sep. 17, 2020

(30) Foreign Application Priority Data
Jul. 25, 2018 (DE) ................ 10 2018 118 016

(51) Int. Cl.
| | |
|---|---|
| *H05K 1/03* | (2006.01) |
| *H05K 3/46* | (2006.01) |
| *H01L 21/48* | (2006.01) |
| *H01L 23/15* | (2006.01) |
| *H01C 7/10* | (2006.01) |
| *H05K 1/02* | (2006.01) |

(52) U.S. Cl.
CPC ............. *H05K 1/036* (2013.01); *H01C 7/10* (2013.01); *H01L 21/4807* (2013.01); *H01L 23/15* (2013.01); *H05K 1/0257* (2013.01); *H05K 1/0306* (2013.01); *H05K 3/4605* (2013.01); *H05K 3/4694* (2013.01); *H05K 2201/017* (2013.01); *H05K 2201/0175* (2013.01)

(58) Field of Classification Search
CPC .... H05K 1/036; H05K 3/4605; H05K 1/0257; H05K 3/4694; H05K 1/0306; H05K 2201/0175; H05K 2201/017; H01L 23/15; H01L 21/4807; H01C 7/10
USPC ........................................... 174/255
See application file for complete search history.

(56) References Cited

U.S. PATENT DOCUMENTS

| | | |
|---|---|---|
| 5,396,034 A | 3/1995 | Fujita et al. |
| 6,534,396 B1 | 3/2003 | Fahn et al. |
| 9,532,454 B2 | 12/2016 | Block et al. |
| 2005/0263867 A1 | 12/2005 | Kambe et al. |
| 2008/0157396 A1* | 7/2008 | Yang ............... H01L 24/20 257/778 |
| 2011/0117498 A1 | 5/2011 | Han et al. |

(Continued)

FOREIGN PATENT DOCUMENTS

DE    102006000935 A1    7/2007

*Primary Examiner* — Sherman Ng
(74) *Attorney, Agent, or Firm* — Slater Matsil, LLP

(57) ABSTRACT

A substrate is disclosed. In an embodiment, a substrate includes a ceramic main body, an organic surface structure on at least one first outer face of the ceramic main body and outer redistribution layers integrated into the organic surface structure.

17 Claims, 2 Drawing Sheets

(56) References Cited

U.S. PATENT DOCUMENTS

2015/0318262 A1\* 11/2015 Gu ................... H01L 25/0655
257/738
2016/0299174 A1 10/2016 Pan et al.

\* cited by examiner

SUBSTRATE

This patent application is a national phase filing under section 371 of PCT/EP2019/069823, filed Jul. 23, 2019, which claims the priority of German patent application 102018118016.0, filed Jul. 25, 2018, each of which is incorporated herein by reference in its entirety.

TECHNICAL FIELD

The present invention relates to a substrate which comprises a ceramic main body.

BACKGROUND

Substrates are widespread component parts in industrial production, in order to arrange and to contact microelectronic components such as integrated circuits and power semiconductors such as LEDs thereon. The microelectronic components and power semiconductors thus mounted can subsequently be easily integrated into further electronic components.

By virtue of ever-increasing requirements in terms of miniaturization and performance capability of the further electronic components, it is necessary to increase the number of microelectronic components and power semiconductors which can be mounted on a given face of a substrate. This results in increasing demands being placed on the substrate in terms of the number of redistribution layers on the given face of the substrate and thermal conductivities of substrate materials. In particular, the thermal conductivity of the substrate material is an important factor. As the number of microelectronic components and power semiconductors which have to be mounted on the given face of the substrate increases, the heat produced by the microelectronic components and power semiconductors has to increasingly be dissipated more efficiently, in order to prevent overheating of the components.

Conventional substrates frequently consist of polymer-based composite materials, which do indeed make possible a sufficiently high number of redistribution layers, but have a very low heat conductivity. This restricts the number of microelectronic components and power semiconductors which, despite the sufficiently high number of redistribution layers, can be mounted on the substrate and makes further miniaturization difficult.

A number of redistribution layers, which makes it possible to increase the number of microelectronic components and power semiconductors which can be mounted on the given face of the substrate in such a manner that miniaturization and/or an improved performance of the further components can be achieved, is referred to here and below as a sufficiently high number of redistribution layers.

In order to achieve an improvement of the thermal conductivity, substrates which have metal inserts are conventionally used. Due to their design, such substrates do not allow any through-connections and redistribution layers inside the substrate in the region of the metal inserts, which leads to a reduction in the number of microelectronic components and power semiconductors which can be mounted on the given face of the substrate. This makes further miniaturization difficult. Moreover, the thermal conductivity of such substrates is limited to 7 to 8 W/m·K, which likewise makes further miniaturization and an improvement in performance difficult.

SUMMARY OF THE INVENTION

Embodiments provide a substrate which has a thermal conductivity greater than 8 W/m·K and makes it possible to provide a sufficiently high number of redistribution layers.

According to an embodiment, a substrate which has a ceramic main body and an organic surface structure is provided on at least one first outer face of the ceramic main body. Outer redistribution layers are integrated into the organic surface structure. The combination of a ceramic main body with an organic surface structure makes it possible to combine the advantages of both materials. Thus, the ceramic main body has a thermal conductivity which is far higher than that of a conventional polymer-based substrate. On the other hand, the organic surface structure makes it possible to manufacture outer redistribution layers in a sufficiently high number, which makes further miniaturization and an increase in the performance capability possible.

The organic surface structure of the substrate can additionally have a plurality of organic layers. A multi-layered construction of the organic surface structure makes it possible, compared with a single-layered construction of the organic surface structure, to further increase the number of the outer redistribution layers on a given face of the substrate. As a result, the number of mounted microelectronic components and power semiconductors on the given face of the substrate can be further increased, as a result of which further miniaturization is made possible. Moreover, due to the higher number of microelectronic components and power semiconductors which are mounted on the given face of the substrate, the performance capability of further components, which comprise the substrate having the microelectronic components and power semiconductors mounted thereon, can also be improved. Thus, the number of LEDs in a LED module having a given face can be increased for example, as a result of which the characteristics of the LED module can be improved.

Moreover, the organic layers of the organic surface structure of the substrate can each contain different organic materials as the main constituent. In other words, each organic layer can have a different composition. As a result, characteristics of the organic layers such as thermal expansion, optical absorption and reflection can be adapted such that they meet the desired requirements.

In particular, the main constituent of the organic surface structure of the substrate can be selected from a group comprising photoresists and filled polymers.

A filled polymer is a polymer which contains a filler which improves the characteristics of the polymer. In an embodiment of the substrate, the main constituent of the organic surface structure can comprise a filled polymer which is filled with ceramic particles in order to increase its thermal conductivity. As a result, the microelectronic components and power semiconductors mounted on the substrate can be protected even better against overheating.

Thanks to the use of a photoresist, the organic surface structure of the substrate can be configured very simply and precisely. As a result, distances between individual redistribution layers can be configured to be so small that further miniaturization and/or an improvement in performance is/are made possible.

In a more advantageous embodiment, a passivation layer can be applied to the first outer face of the ceramic main body of the substrate. The organic surface structure is applied to the passivation layer. In other words, the passivation layer is located between the first outer face of the ceramic main body and the organic surface structure. The arrangement of the passivation layer and of the organic surface structure just described can similarly be utilized for more than one outer face of the ceramic main body.

The passivation layer protects the ceramic main body against possible corrosion which can occur during the manufacture of the organic surface structure, for example due to the solvents used. The passivation layer can contain inorganic materials which are selected from a group comprising $SiO_2$, SiN, AlN and glasses.

The organic surface structure of the substrate can additionally have a thermal expansion coefficient which corresponds to that of the ceramic main body. The deviation of the thermal expansion coefficient of the organic surface structure based on the thermal expansion coefficient of the ceramic main body is a maximum of ±1 ppm/K. In particular, the organic surface structure can have a thermal expansion coefficient which lies in a range between 2 ppm/K and 12 ppm/K. Due to the very similar thermal expansion coefficients of the organic surface structure and of the ceramic main body of the substrate, tensions between the organic surface structure and the ceramic main body during a thermal load, by way of example due to the heat given off by a power semiconductor, are avoided to the greatest possible extent. This results in a higher service life of the substrate.

Furthermore, the ceramic main body of the substrate can have a thermal conductivity of more than 8 W/m·K. In more advantageous embodiments of the substrate, the ceramic main body can have a thermal conductivity of more than 20 W/m·K, in particular of more than 100 W/m·K. Such a high thermal conductivity makes it possible to efficiently dissipate the heat produced by the microelectronic components and power semiconductors mounted on the substrate. As a result, overheating of the components mounted on the carrier is virtually excluded, as a result of which further miniaturization and/or an increase in the performance capability can be made possible.

In order to make such a high thermal conductivity of the ceramic main body of the substrate possible, the main constituent of the ceramic main body can be selected from a group comprising ZnO—Bi, ZnO—Pr, $Al_2O_3$ and AlN.

The ceramic main body of the substrate can additionally contain a thermally conductive functional ceramic as the main constituent. Functional ceramics are ceramics, the characteristics of which have been optimized for an application in a technical field. Thus, a functional ceramic can, for example, have an electrical conductivity which rises as the temperature increases. The ceramic main body of the substrate can have a functional ceramic, which is selected from a group comprising ceramics having negative temperature coefficients (NTC ceramics), positive temperature coefficients (PTC ceramics) and varistor ceramics, as the main constituent.

In particular, using a varistor ceramic makes it possible to realize an overvoltage protection within the ceramic main body of the substrate. It is thus possible to dispense with the provision of the overvoltage protection by means of a discrete component to be fitted on the substrate. As a result, the substrate can, together with the microelectronic components and power semiconductors mounted on it, have a more compact construction.

Furthermore, the ceramic main body of the substrate can have inner redistribution layers and vias. In particular, the presence of inner redistribution layers makes it possible to integrate heavily loaded lines such as, by way of example, power lines to the power semiconductors or integrated circuits into the ceramic main body of the substrate. Since the ceramic main body of the substrate has a higher thermal conductivity than conventional polymer-based substrates, the heat given off by such lines can be dissipated even more efficiently and overheating of the microelectronic components and power semiconductors mounted on the substrate can be effectively prevented.

In order to realize the inner redistribution layers and the overvoltage protection integrated into the ceramic main body, the ceramic main body of the substrate can comprise a plurality of ceramic layers.

The ceramic main body of the substrate can additionally be wholly or partially embedded in an organic printed circuit board. In particular, the main constituent of the organic printed circuit board can, for example, comprise a composite made of epoxy resin and glass fibers.

In particular, the thermal expansion coefficient of the organic printed circuit board can be adapted to the thermal expansion coefficient of the ceramic main body in such a manner that the thermal expansion coefficient of the printed circuit board deviates by a maximum of ±1 ppm/K from the thermal expansion coefficient of the ceramic main body. As a result, tensions which occur due to thermal loads, for example due to an LED, between the substrate and the organic printed circuit board, can be largely prevented. As a result, the service life of the substrate, which is wholly or partially embedded in the organic printed circuit board, can be extended.

The organic printed circuit board can additionally likewise have an organic surface structure, and outer and inner redistribution layers. The ceramic main body of the substrate and the organic printed circuit board can be connected to one another in a conductive manner by means of inner and outer redistribution layers.

Furthermore, the substrate and/or the organic printed circuit board can have outer redistribution layers which consist of a first metal and inner redistribution layers which consist of a second metal, the first metal differing from the second metal. The first metal and the second metal can be selected from a group of metals comprising copper and silver. Using different metals makes it possible to optimally adapt the thermal expansion coefficients of the inner and outer redistribution layers to the material, in which they are integrated. This reduces mechanical loads in the substrate and improves the service life of the substrate.

The substrate can be manufactured by conventional methods. Such a method can, for example, comprise the substeps:
   providing a ceramic main body,
   applying a passivation layer to a first outer face of the ceramic main body,
   applying a first organic layer to the passivation layer, wherein regions on the passivation layer, which are to become part of the outer redistribution layers, are not be coated, or the coating is removed there,
   applying a first metal layer to the first organic layer and the regions of the passivation layer, which are to become part of the outer redistribution layers,
   applying a second organic layer to the first metal layer, wherein the regions on the passivation layer, which are to become part of the outer redistribution layers and regions on the first organic layer, which are likewise to become part of the outer redistribution layers, are not coated,
   applying a second metal layer to the regions on the passivation layer and the first organic layer, which are to form the outer redistribution layers,
   removing the second organic layer and the first metal layer in order to form the outer redistribution layers, wherein the first metal layer is only removed in the regions which do not form the outer redistribution layers. Additionally, the regions on the passivation layer and the first organic layer, which form the outer redistribution layers, are configured in such a manner that an electrically conductive contact between the respective regions exists.

By repeating the method steps just set out, it is possible to manufacture a second plane or further planes having structured metallizations for a redistribution layer.

BRIEF DESCRIPTION OF THE DRAWINGS

The invention is described in greater detail below with reference to exemplary embodiments and accompanying figures.

DETAILED DESCRIPTION OF ILLUSTRATIVE EMBODIMENTS

Figure 1:
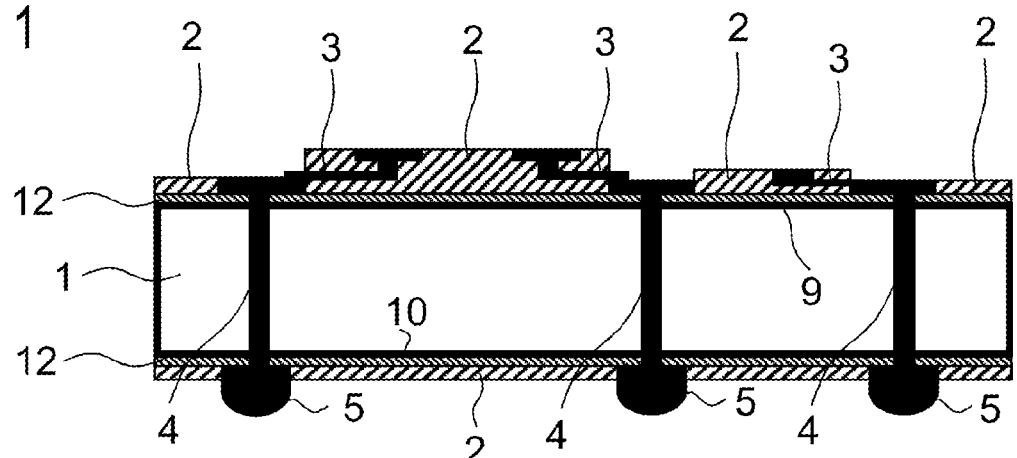
FIG. 1 shows a schematic cross-section of an embodiment of the substrate.

The same elements, similar or apparently identical elements are provided with the same reference numerals in the figures. The figures and the proportions regarding size in the figures are not true to scale.

FIG. 1 shows a schematic cross-section of an embodiment of a substrate, having a ceramic main body 1, a passivation layer 12 on a first outer face 9 and on a second outer face 10 of the ceramic main body 1. Moreover, organic surface structures 2 are configured on the passivation layers 12. The passivation layers 12 are, for example, 100 nm thick and contain by way of example SiN. The passivation layers 12 protect the ceramic main body 1 against corrosion, for example, due to aggressive solvents which are deployed during the manufacture of the organic surface structure 2. Outer redistribution layers 3 are additionally integrated into the organic surface structures 2. By virtue of the organic surface structures 2 on the first outer face 9 and the second outer face 10, it is possible to contact the microelectronic components and power semiconductors (not depicted) mounted on the first outer face 9 by way of vias 4 by means of contacts 5 which are configured on the second outer face 10. This type of contacting makes, for example, the transition from a contacting plane having relatively large contact distances to a contacting plane having relatively small contact distances possible. Moreover, the ceramic main body comprises AlN as the main constituent which has a thermal conductivity of more than 100 W/m·K. This makes a highly efficient dissipation of the heat possible which is given off by microelectronic components and power semiconductors (not depicted) mounted on the substrate. This efficiently prevents overheating of the same. In combination with the organic surface structure 2, which makes a sufficiently high number of outer redistribution layers 3 possible, it is possible to reduce distances between components mounted on the substrate and, consequently, make possible further miniaturization and an improvement in performance.

Figure 2:
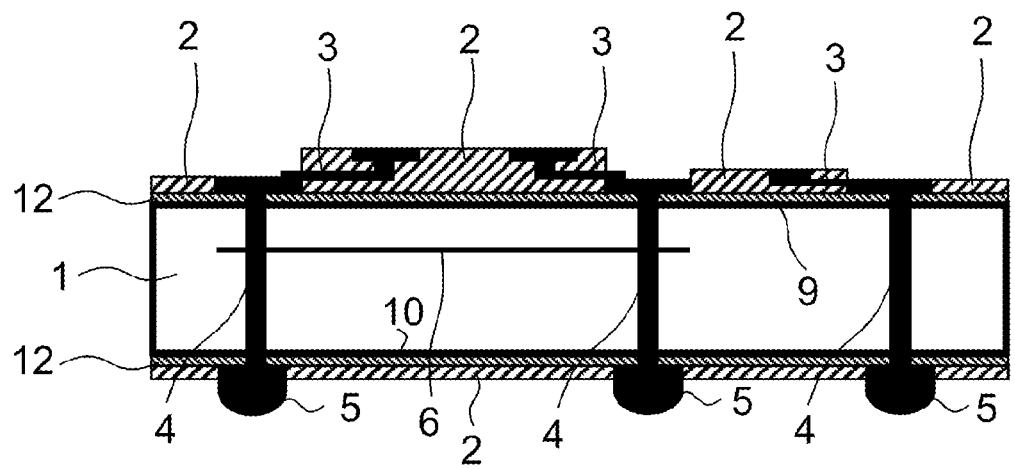
FIG. 2 shows a schematic cross-section of an embodiment of the substrate having inner redistribution layers.

FIG. 2 shows a schematic cross-section of a further embodiment of a substrate. In addition to the embodiment according to FIG. 1, the ceramic main body 1 has inner redistribution layers 6. Thanks to the inner redistribution layers 6, it is possible to integrate heavily loaded lines into the ceramic main body 1, which has a better thermal conductivity than conventional polymer-based substrates. This constitutes a further protection of the microelectronic components and power semiconductors (not depicted) mounted on the substrate against overheating. As a result, it is possible to increase the number of the microelectronic components and power semiconductors mounted on the substrate on a given face of the substrate. This effectively prevents overheating of the same. This makes a more compact design of the substrate possible.

Figure 3:
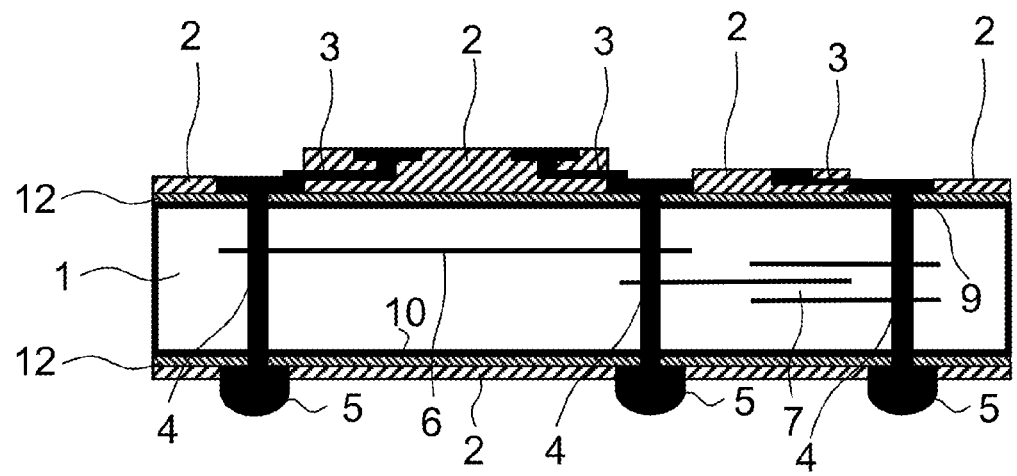
FIG. 3 shows a schematic cross-section of an embodiment of the substrate having inner redistribution layers and integrated overvoltage protection.

FIG. 3 shows a schematic cross-section of another embodiment of a substrate. In addition to that described in FIG. 2, the ceramic main body has an overvoltage protection 7. For this purpose, the ceramic main body 1 comprises a varistor ceramic, whose main constituent is for example ZnO—Pr. Thanks to the integration of the overvoltage protection 7 into the ceramic main body 1, it is possible to dispense with the configuration of the overvoltage protection 7 as a discrete component on the outer surface of the substrate. This creates a greater area for microelectronic components and power semiconductors which can be mounted on the substrate.

Figure 4:
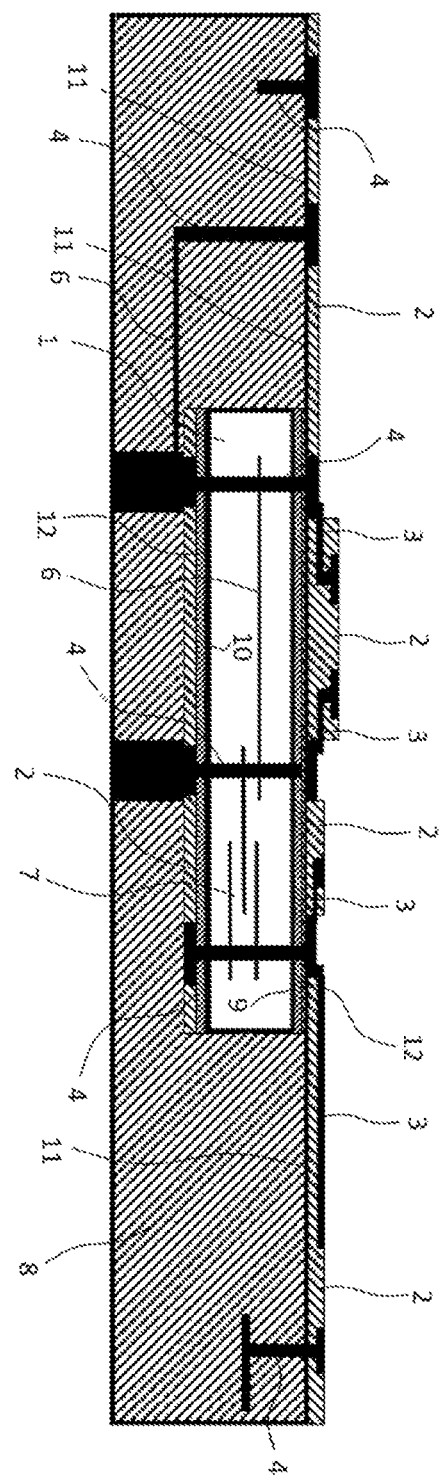
FIG. 4 shows a schematic cross-section of an embodiment of the substrate, wherein the substrate is embedded in an organic printed circuit board.

FIG. 4 shows a schematic cross-section of an embodiment of a substrate which can be configured similarly to that in FIG. 3, but which is embedded in a recess of a surface ii of an organic printed circuit board 8. The passivation layer 12, which is applied to the first outer face 9 of the ceramic main body, terminates flush with the surface ii of the printed circuit board 8. The main constituent of the organic printed circuit board 8 can, for example, comprise glass fibers and epoxy resin. The substrate which is similar to that described in FIG. 3 and the organic printed circuit board 8 both have an organic surface structure 2 having integrated outer redistribution layers 3. The substrate which is similar to that described in FIG. 3 and the organic printed circuit board 8 are connected to one another in a conductive manner by means of inner redistribution layers 6 and outer redistribution layers 3. Thanks to the embedding of the substrate in the organic printed circuit board, it is in particular possible to have recourse to standard sizes for ceramic main bodies 1 and for organic printed circuit boards 8, which simplifies production and, as a result, cuts costs, since no special sizes, for example for the ceramic main body 1, have to be produced.

The invention claimed is:

1. A substrate comprising: a ceramic main body; an organic surface structure on at least one first outer face of the ceramic main body; and outer redistribution layers integrated into the organic surface structure, wherein the ceramic main body comprises an integrated overvoltage protection.

2. The substrate according to claim 1, wherein the organic surface structure comprises a plurality of organic layers.

3. The substrate according to claim 2, wherein the organic layers of the organic surface structure contain different organic materials, and wherein the organic materials are selected from the group consisting of photoresists and filled polymers, as main constituent.

4. The substrate according to claim 1, wherein a passivation layer and the organic surface structure are arranged on the at least one first outer face of the ceramic main body, wherein the passivation layer is located between the first outer face of the ceramic main body and the organic surface structure, and wherein the passivation layer contains an inorganic material as main constituent, the inorganic material selected from the group consisting of $SiO_2$, AlN, SiN and glasses.

5. The substrate according to claim 1, wherein the ceramic main body has a thermal conductivity of more than 8 W/m-K.

6. The substrate according to claim 1, wherein main constituent of the ceramic main body are selected from the group consisting of ZnO—Bi, ZnO—Pr, $Al_2O_3$ and AlN.

7. The substrate according to claim 1, wherein the ceramic main body contains a functional ceramic selected from the group consisting of varistor ceramics, NTC ceramics and PTC ceramics.

8. The substrate according to claim 1, wherein the ceramic main body comprises inner redistribution layers and vias.

9. The substrate according to claim 8, wherein the outer redistribution layers consists essentially of a first metal and the inner redistribution layers consist essentially of a second metal, the first metal differing from the second metal.

10. The substrate according to claim 9, wherein the first metal and the second metal are selected from the group consisting of copper and silver.

11. The substrate according to claim 1, wherein the organic surface structure has a thermal expansion coefficient corresponding to that of the ceramic main body with a deviation of a maximum of ±1 ppm/K.

12. The substrate according to claim 1, wherein the ceramic main body comprises a plurality of ceramic layers.

13. The substrate according to claim 1, wherein the ceramic main body is wholly or partially embedded in an organic printed circuit board, wherein a thermal expansion coefficient of the organic printed circuit board corresponds to that of the ceramic main body with a deviation of a maximum of ±1 ppm/K.

14. The substrate according to claim 13, wherein the ceramic main body and the organic printed circuit board have on at least one outer face an organic surface structure with integrated outer redistribution layers.

15. The substrate according to claim 13, wherein the ceramic main body and the organic printed circuit board are connected to one another in a conductive manner by outer redistribution layers and/or inner redistribution layers.

16. The substrate according to claim 15, wherein the outer redistribution layers consist essentially of a first metal and the inner redistribution layers consist essentially of a second metal, the first metal being different from the second metal.

17. The substrate according to claim 16, the first metal and the second metal being selected from a group of metals, comprising copper and silver.

* * * * *